United States Patent [19]

Lizee

[11] Patent Number: 4,958,059
[45] Date of Patent: Sep. 18, 1990

[54] ELECTRONIC BOMBARDMENT EVAPORATOR EQUIPPED WITH MEANS TO RECOVER BACKSCATTERED ELECTRONS

[75] Inventor: Jean-Francois Lizee, Paris, France

[73] Assignee: Commissariat a l'Energie Atomique, Paris, France

[21] Appl. No.: 374,474

[22] Filed: Jun. 30, 1989

[30] Foreign Application Priority Data

Jul. 6, 1988 [FR] France ............... 88 09156

[51] Int. Cl.⁵ ............................ B23K 15/00
[52] U.S. Cl. .................... 219/121.34; 219/121.15
[58] Field of Search ............... 219/121.16, 121.17, 219/121.15, 121.12, 121.34, 121.35; 373/12–14

[56] References Cited

U.S. PATENT DOCUMENTS

| | | | |
|---|---|---|---|
| 3,244,855 | 4/1966 | Cauley | 373/12 X |
| 3,390,249 | 6/1968 | Hanks | 373/12 X |
| 3,467,057 | 9/1969 | Tamura et al. | 219/121.29 |
| 3,876,879 | 4/1975 | McAdams et al. | 250/310 X |
| 3,949,187 | 4/1976 | Wulff | 219/121.15 |
| 4,262,160 | 4/1981 | McKoon et al. | 373/711 |
| 4,309,589 | 1/1982 | Hashimoto et al. | 219/121.34 |
| 4,551,844 | 11/1985 | Arendt et al. | 373/12 |
| 4,760,254 | 7/1988 | Pierce et al. | 250/307 X |

OTHER PUBLICATIONS

Thin Solid Films, vol. 110, No. 2, Dec. 1983, pp. 149–164, Elsevier Sequoia/Printed in the Netherlands, Lausanne, CH; S. Schiller et al.

Primary Examiner—C. L. Albritton
Attorney, Agent, or Firm—Michael N. Meller

[57] ABSTRACT

Electronic bombardment evaporator equipped with means to recuperate backscattered electrons by a target (14) submitted to a bombardment by an electronic beam (12) comprising means to collect the backscattered electrons, said means (26) being brought to a Vc potential so that the electrons backscattered by the target (14) are attracted by said means (26), and a power source (30) connected firstly to the means (26) to collect the backscattered electrons and polarizing them to the VC potential, and secondly to the main power source (18) of the electron gun (10), supplying the latter with the intensity Ic originating from the recuperation of the backscattered electrons.

3 Claims, 2 Drawing Sheets

ELECTRONIC BOMBARDMENT EVAPORATOR EQUIPPED WITH MEANS TO RECOVER BACKSCATTERED ELECTRONS

FIELD OF THE INVENTION

The object of the present invention is to produce an electronic bombardment evaporator equipped with means to recover backscattered electrons.

BACKGROUND OF THE INVENTION

A target (usually made of metal) is heated under the effect of a beam of electrons in an electronic bombardment evaporator.

As shown on FIG. 1, an evaporator comprises an electron gun 10 transmitting a jet of electrons 12 accelerated under several tens of kilovolts. A d.c. power source 18 generates on an output S1 a potential difference between the cathode 20 and the anode 22 of the electron gun 10. The path 12 of the beam is curved by a magnetic field B of several tens of Gausses. The beam 12 thus directed hits the target 14 contained in the crucible 16 and thus heats it until it reaches its evaporation temperature.

In normal use conditions, the power source 18 supplies a current Io of 10A for a voltage Vo of $-30$ kV between the cathode 20 and anode 22, for example. The beam of electrons 12 exposing the target 14 to radiation then possesses an incident power Po of 300 kW. However, this incident power Po is not entirely consumed by the heating of the target 14. In particular, one part of the power Po is lost via the re-emission by the target 14 of the secondary electrons These secondary electrons are of two types:

The actual secondary electrons forming a surface emission characterized by low energy (less than 50 eV), the backscattered electrons due to elastic impacts inside the target 14; these are comparable to the electrons reflected by the target 14.

The paths 24 of these secondary electrons are themselves also curved by the magnetic field B. The energy spectrum and the spatial distribution of these secondary electrons essentially depend on three parameters: the energy of the incident beam 12, the angle of incidence and the atomic number of the target 14.

SUMMARY OF THE INVENTION

The object of the present invention is to recuperate a fraction of the energy borne by these backscattered type of secondary electrons so as to use it again in the bombardment process.

More precisely, the present invention concerns an electronic bombardment evaporator equipped with means to recover electrons backscattered by a target subjected to a bombardment by an electronic beam derived from an electron gun with an electrode being connected to an output S1 of a first d.c. power supply, this first power supply furnishing a negative potential Vo with respect to the potential of the target on its output S1, wherein it includes:

means to collect said backscattered electrons, said means being brought to a negative potential Vc less in absolute value than Vo, a second d.c. power supply connected via a first output S2 to the means to collect the backscattered electrons, said first output S2 being brought to the potential Vc, the second power supply also being connected via a second output S3 to the output S1 of the first power supply, the second output S3 being brought to the potential Vo.

Preferably, the means to collect said backscattered electrons consist of a metallic trapping cage recuperating any electron due to a backscattering occuring inside said cage.

The shape of this trapping cage is adapted to the shape of the jet of the electrons backscattered by the target. It may be cylindrical or parallelpiped-shaped.

Preferably, for a linear electron gun, the trapping cage has a parallelpiped shape, and aperture being provided in the cage so as to allow for introduction of the backscattered electrons jet.

BRIEF DESCRIPTION OF THE DRAWINGS

The characteristics and advantages of the invention shall appear more readily from a reading of the following description, given by way of explanation and being in no way restrictive, with reference to the accompanying drawings in which.

DETAILED DESCRIPTION OF THE PREFERRED EMBODIMENTS

Figure 1:
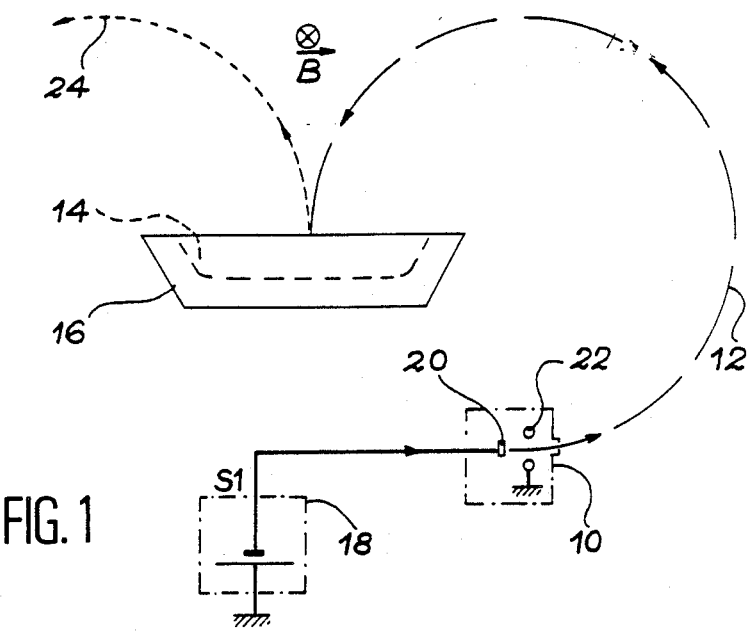
FIG. 1, described, diagrammatically represents an electronic bombardment evaporator, FIG. 2 diagrammatically represents this same evaporator provided with a device according to the invention, FIG. 3 diagrammatically represents the variations of the power Pc recuperated by a device according to the invention and according to the potential Vc, FIG. 4 diagrammatically shows a perspective view of a trapping cage.
Figure 2:
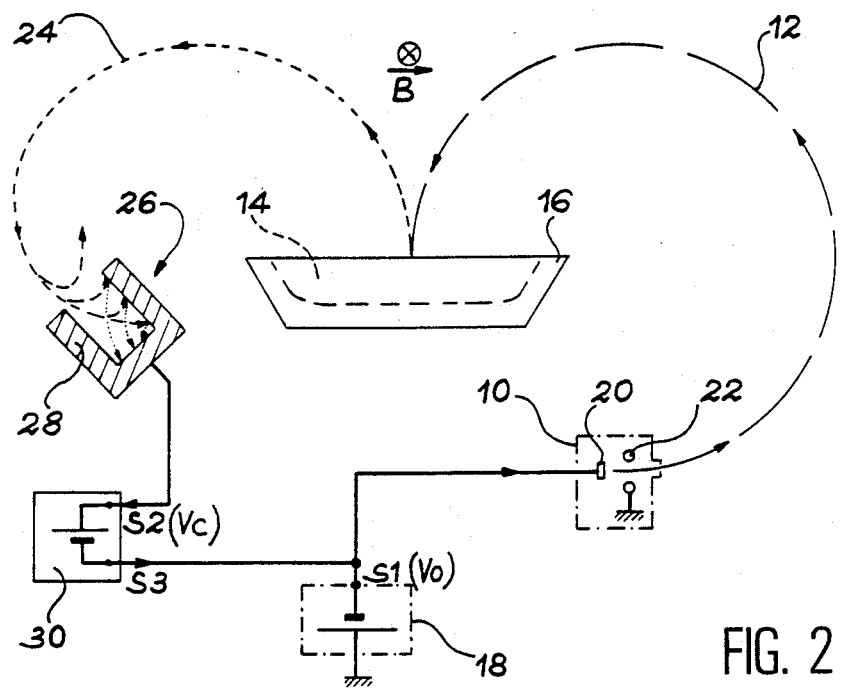

FIG. 2 diagrammatically represents an evaporator provided with a device according to the invention.

The paths 24 of the secondary electrons emitted by the target 14 are curved under the effect of the applied magnetic field B. Means 26 are placed on these paths 24 so as to collect the "secondary" electrons. Preferably, these means 26 are formed of a metal trapping cage 28 brought to a potential Vc. It is possible, for example, to use a copper cage cooled by a circulation of oil.

Figure 3:
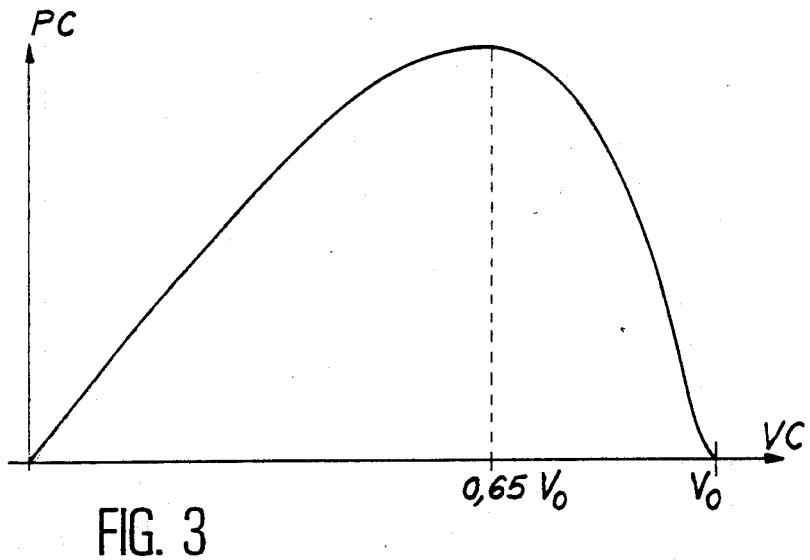

FIG. 3 diagrammatically represents the variations of the power Pc recuperated by a device according to the invention and according to the value of Vc. In this example, this power Pc presents a maximum for a value of Vc equal approximately of 0.65 Vo.

In normal operating conditions, this value is such that only the backscattered electrons are captured by the trapping cage 28. The "genuine secondary" low energy electrons are pushed back by the trapping cage 28.

Generally speaking, in an evaporator, electronic bombardment is effected in a lap form. The beam 12 of electrons thus hits the target 14 along a strip; the efficiency of heating is then increased since the electrons are distributed over the target 14. The secondary electrons are also sent back in the form of a lap. So as to capture all the electrons of the lap, the trapping cage 28 has, for example, the shape of a rectangular parallelpiped.

Figure 4:
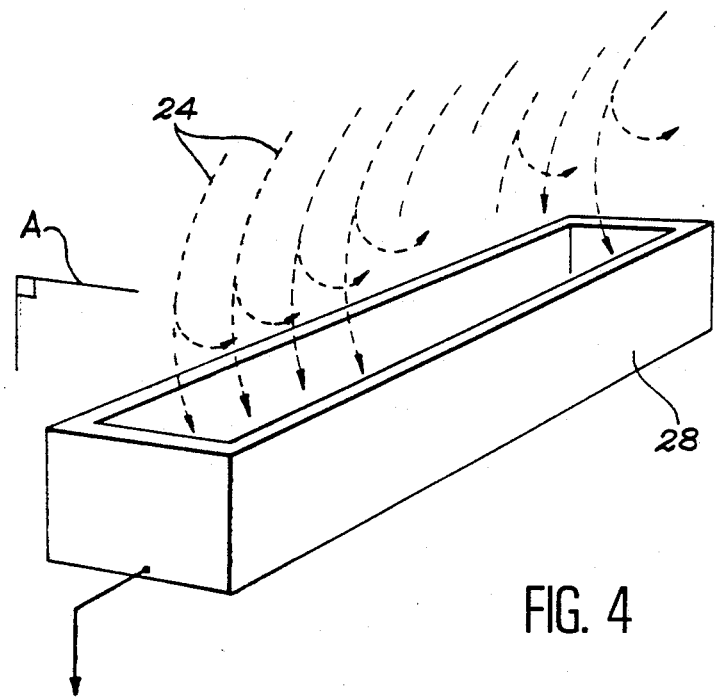

FIG. 4 diagrammatically shows a perspective view of the trapping cage 28. The lap of the backscattered electrons is attracted, whereas the real secondary electrons are pushed back. Reverting to FIG. 2, this shows a cutaway view of the trapping cage along the plane A. A power source 30 is connected via a first output S2 to the trapping cage 28. This output S2 is brought to the potential Vc. A second output S3 of this power source 30 is connected to the output S1 of the power source 18. This second output S3 is thus brought to the potential Vo which serves as a reference potential.

The power Pc recuperated by the device according to the invention is not equal to the effective power Pe of the backscattered electrons captured by the trapping cage. Subtracted from this cage is the braking power Pf expended by the electrons upon arrival in the trapping cage 28. The power Pc recuperated by the device is thus equal to Pe-Pf.

Inside the tapping cage, there also occurs an emission of secondary electrons. But all these electrons are trapped inside the trapping cage 28, firstly under the effect of the applied magnetic field B, and secondly by virtue of the geometry of the trapping cage 28.

EXAMPLE

Incident power on the target: Po=300 kW.

Power of backscattered electrons (lost for heating of the target): PR=111 kW.

This power corresponds to a backscattering coefficient: CR=0.5.

Intensity of backscattered electrons: IR=5A.

Power of electrons not collected by the device=17 kW.

Effective incident power of the electrons captured by the trapping cage: Pe=94 kW.

Braking power lost by the trapped electrons: Pf=22 kW.

Recuperated power: Pc=72 kW.

Intensity corresponding to the recuperated power: IC=3.7 A

Power furnished by the power source 30:39 kW.

Power delivery on the second output 83 of the power source 30 on the output S1 of the power source 18 connected to the cathode of the electron gun: PC+39 kW=111 kW.

Intensity delivered by the second output S3 of the power source 30: IC=3.7 A.

Output S2 of the power source 30 brought to the potential: Vc=−19.5 kV.

Output S3 of the power source 30 brought to the potential: Vo=−30 kV.

This example shows that 72 kW of the 111 kW lost for heating the target can be recuperated. As the power source 30 supplies the difference (39 kW), it is possible to reuse the total power (111 kW) lost in the evaporation process.

If the power source 30 is required to provide the power, only the intensity recuperated by the trapping cage (IC=3.7 A) is sent back onto the output S1 of the main power unit 18. This supply of intensity makes it possible to relieve the main power unit which shall only provide 6.3A so that about 10A are delivered onto the cathode 20. The main power supply unit 18 shall only expend 189 kW in order to send a beam of electrons 12 with a power Po=300 kW onto the target. The advantages of a device according to the invention are thus clearly evident.

What is claimed is:

1. Electronic bombardment evaporator provided with means for recovering electrons backscattered by a target subjected to a bombardment by an electronic beam, said beam originating from an electron gun with an electrode connected to an output S1 of a first d.c. power source, said power source furnishing a negative potential Vo on its output S1, wherein it includes:
    means to collect said backscattered electrons, said means being brought to a potential Vc so that the electrons backscattered by the target are attracted by said means,
    a second d.c. power source connected via a first output S2 to the means to collect the backscattered electrons, said first output being brought to the potential Vc, the second power source being also connected via a second output S3 to the output S1 of the first power source, the second output S3 being brought to the potential Vo.

2. Evaporator according to claim 1, wherein the means to collect said backscattered electrons consist of a metal trapping cage recuperating any electron due to a backscattering occuring inside said cage.

3. Evaporator according to claim 2, wherein the trapping cage is a parallelpiped.

* * * * *